(12) United States Patent
Kim et al.

(10) Patent No.: US 8,823,041 B2
(45) Date of Patent: Sep. 2, 2014

(54) LIGHT EMITTING DIODE PACKAGE AND LIGHT EMITTING MODULE COMPRISING THE SAME

(75) Inventors: Byoung Sung Kim, Ansan-si (KR); Sang Eun Lim, Ansan-si (KR); Jae Jin Lee, Ansan-si (KR); Yeoun Chul Son, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 13/567,776

(22) Filed: Aug. 6, 2012

(65) Prior Publication Data

US 2013/0107548 A1     May 2, 2013

Related U.S. Application Data

(63) Continuation-in-part of application No. 13/340,867, filed on Dec. 30, 2011, now Pat. No. 8,692,282.

(30) Foreign Application Priority Data

Oct. 27, 2011  (KR) .................. 10-2011-0110651
Mar. 15, 2012  (KR) .................. 10-2012-0026663

(51) Int. Cl.
*H01L 33/00*  (2010.01)
*H01L 33/62*  (2010.01)
*H01L 33/48*  (2010.01)
*H01L 33/64*  (2010.01)
*F21V 29/00*  (2006.01)
*F21Y 101/02*  (2006.01)

(52) U.S. Cl.
CPC .............. *H01L 33/62* (2013.01); *H01L 33/486* (2013.01); *H01L 33/642* (2013.01); *F21V 29/2206* (2013.01); *F21V 29/2262* (2013.01); *F21Y 2101/02* (2013.01); *H01L 2224/48257* (2013.01); *H01L 2224/48091* (2013.01); *H01L 2224/48247* (2013.01); *H01L 2224/49107* (2013.01)

USPC .......................................................... 257/99

(58) Field of Classification Search
CPC .............. H01L 33/62; H01L 33/486; H01L 2224/48091; H01L 2224/48257; H01L 2224/48247; H01L 2224/49107; H01L 2924/00014; F21V 29/2206; F21V 29/2262; F21Y 2101/02
USPC .................................................. 257/98, 99, 100
See application file for complete search history.

(56) References Cited

U.S. PATENT DOCUMENTS 6,376,902 B1 *  4/2002  Arndt ............................ 257/678
7,271,425 B2 *  9/2007  Arndt et al. ..................... 257/99

(Continued)

FOREIGN PATENT DOCUMENTS

| EP | 2284914 | 2/2011 |
|---|---|---|
| KR | 10-2010-0063877 | 6/2010 |
| KR | 10-2010-0093950 | 8/2010 |

OTHER PUBLICATIONS

Non-Final Office Action issued on Apr. 15, 2013 in U.S. Appl. No. 13/340,867.

(Continued)

*Primary Examiner* — Nikolay Yushin
(74) *Attorney, Agent, or Firm* — H.C. Park & Associates, PLC

(57) ABSTRACT

Exemplary embodiments of the present invention provide a light emitting diode package including a light emitting diode chip, a lead frame having a chip area on which the light emitting diode chip is arranged, and a package body supporting the lead frame. The lead frame includes a first terminal group arranged at a first side of the chip area and a second terminal group arranged at a second side of the chip area. The first terminal group and the second terminal group each include a first terminal connected to the chip area and a second terminal separated from the chip area, and the width of the first terminal is different than the width of the second terminal outside the package body.

9 Claims, 12 Drawing Sheets

(56) References Cited

U.S. PATENT DOCUMENTS

| | | |
|---|---|---|
| 7,626,250 B2 * | 12/2009 | Lee et al. .................. 257/675 |
| 2004/0126913 A1 | 7/2004 | Loh |
| 2006/0103012 A1 * | 5/2006 | Chin .......................... 257/712 |
| 2007/0252246 A1 * | 11/2007 | Ng et al. .................... 257/666 |
| 2010/0155748 A1 * | 6/2010 | Chan et al. .................. 257/89 |
| 2010/0155771 A1 | 6/2010 | Bando |
| 2011/0031865 A1 | 2/2011 | Hussell et al. |
| 2011/0127569 A1 | 6/2011 | Mineshita |
| 2011/0316022 A1 | 12/2011 | Hussell |

OTHER PUBLICATIONS

International Search Report of PCT/KR2012/008726 was mailed Feb. 21, 2013.
Written Opinion of PCT/KR2012/008726 was mailed Feb. 21, 2013.
Final Office Action dated Sep. 9, 2013 in U.S. Appl. No. 13/340,867.
Notice of Allowance dated Nov. 25, 2013 in U.S. Appl. No. 13/340,867.

* cited by examiner

LIGHT EMITTING DIODE PACKAGE AND LIGHT EMITTING MODULE COMPRISING THE SAME

This application is a continuation-in-part of U.S. application Ser. No. 13/340,867, filed on Dec. 30, 2011, and claims priority from and the benefit of Korean Patent Application No. 10-2011-0110651, filed on Oct. 27, 2011, and Korean Patent Application No. 10-2012-0026663, filed on Mar. 15, 2012, which are all hereby incorporated by reference for all purposes as if fully set forth herein.

BACKGROUND

1. Field

Exemplary embodiments of the present invention relate to a light emitting diode package and a light emitting module including the same.

2. Discussion of the Background

Generally, a light emitting diode package may include a light emitting diode chip, a lead frame, and a package body. The lead frame may include a plurality of terminals having different polarities. The package body may support the lead frame. The terminals may extend from the interior of the package body to the outside of the package body. The light emitting diode chip may be electrically connected to the terminals inside the package body. The package body may be formed of a plastic resin or ceramic material. The package body made of plastic material may have a cavity, which receives the light emitting diode chip while optically exposing the light emitting diode chip therethrough. Or, the package body may be at least partially transparent to allow light generated by the light emitting diode chip to be emitted to the outside therethrough.

A light emitting diode package having a plurality of terminals exposed to the outside of a package body may have some terminals exposed through one side of the package body and the other terminals exposed through the other side thereof. The terminals disposed at the one side of the package body and the terminals disposed at the other side of the package body may be connected to each other in a crossing region within the package body, on which the light emitting diode chip is mounted.

In one example of a conventional light emitting diode package, a separate terminal may be placed between two terminals disposed at one side of the package body, and another separate terminal may be placed between two terminals disposed at the other side of the package body.

In such a conventional light emitting diode package, the terminals may have a restricted width and may be arranged at restricted intervals within the restricted area of the package body, thereby causing failure upon electrical testing of the light emitting diode package.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light emitting diode package that includes terminals having suitable shapes, sizes, and arrangement, or a combination thereof, to improve reliability of electrical testing and/or reliability of bonding to a printed circuit board.

Additional features of the invention will be set forth in the description which follows, and in part will be apparent from the description, or may be learned by practice of the invention.

An exemplary embodiment of the present invention provides a light emitting diode package including a light emitting diode chip, a lead frame including a chip area on which the light emitting diode chip is arranged, and a package body supporting the lead frame. The lead frame includes a first terminal group arranged at a first side of the chip area and a second terminal group arranged at a second side of the chip area. The first terminal group and the second terminal group each comprise a first terminal connected to the chip area and a second terminal separated from the chip area, and the width of the first terminal is different than the width of the second terminal outside the package body.

An exemplary embodiment of the present invention also provides a light emitting diode package including a light emitting diode chip, a lead frame including a chip area on which the light emitting diode chip is arranged, and a package body supporting the lead frame. The lead frame includes a first terminal group arranged at a first side of the chip area and a second terminal group arranged at a second side of the chip area, wherein the first terminal group comprises a first terminal and a second terminal extending from the first side of the chip area, and a fifth terminal separated from the chip area and arranged between the first terminal and the second terminal. The second terminal group includes a third terminal and a fourth terminal extending from the second side of the chip area, and a sixth terminal separated from the chip area and arranged between the third terminal and the fourth terminal. The fifth terminal has a greater width than the first terminal and the second terminal inside the package body.

An exemplary embodiment of the present invention also provides a light emitting module including a printed circuit board and a light emitting diode package arranged on the printed circuit board. The light emitting diode package includes a light emitting diode chip, a lead frame having a chip area on which the light emitting diode chip is arranged, and a package body supporting the lead frame. The lead frame includes a first terminal group arranged at a first side of the chip area and a second terminal group arranged at a second side of the chip area, wherein the first terminal group and the second terminal group each includes a first terminal connected to the chip area and a second terminal separated from the chip area, wherein the width of the first terminal is different than the width of the second terminal outside the package body.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 6a and FIG. 6b are side views of the light emitting module shown in

FIG. 4, showing opposite sides of the light emitting module.

DETAILED DESCRIPTION OF THE ILLUSTRATED EMBODIMENTS

Figure 1:
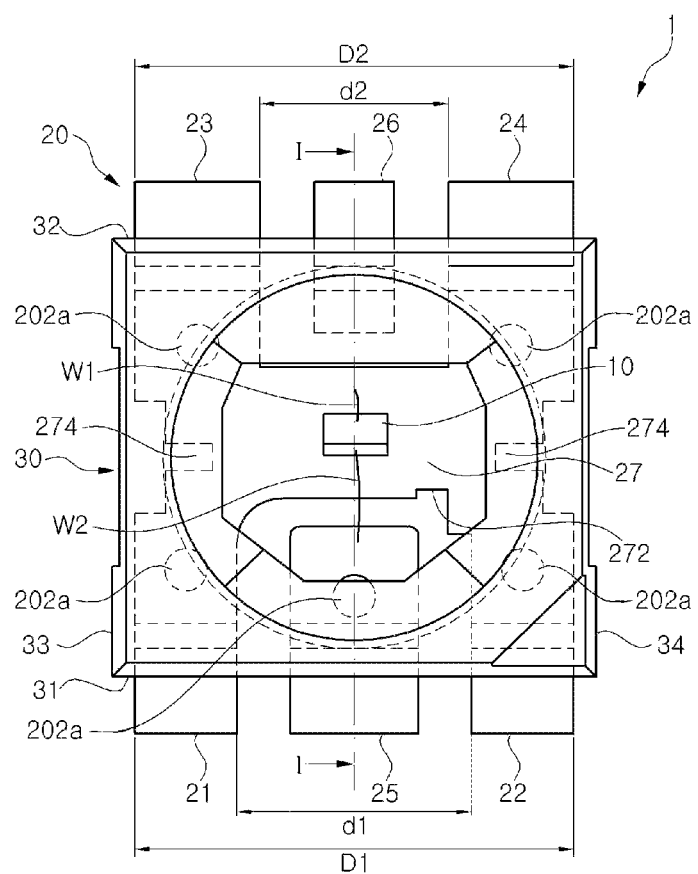
FIG. 1 is a plan view of a light emitting diode package in accordance with an exemplary embodiment of the present invention.

The present invention will be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like elements will be denoted by like reference numerals and repeated descriptions thereof will be omitted herein.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
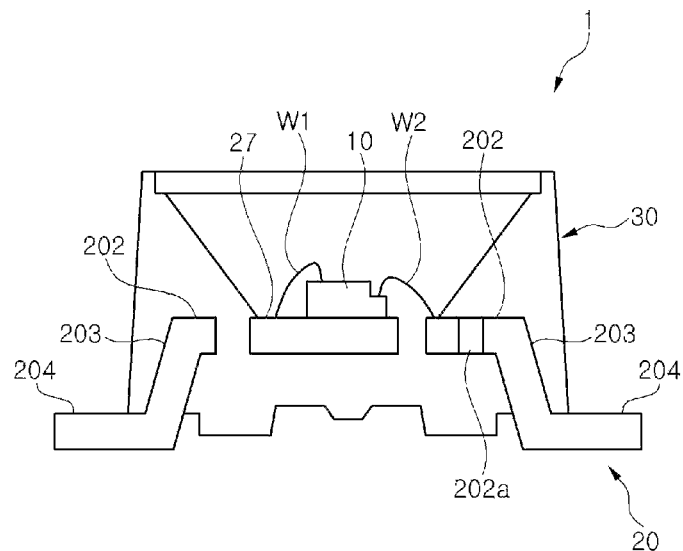
FIG. 2 is a cross-sectional view taken along line I-I of FIG. 1.
Figure 3:
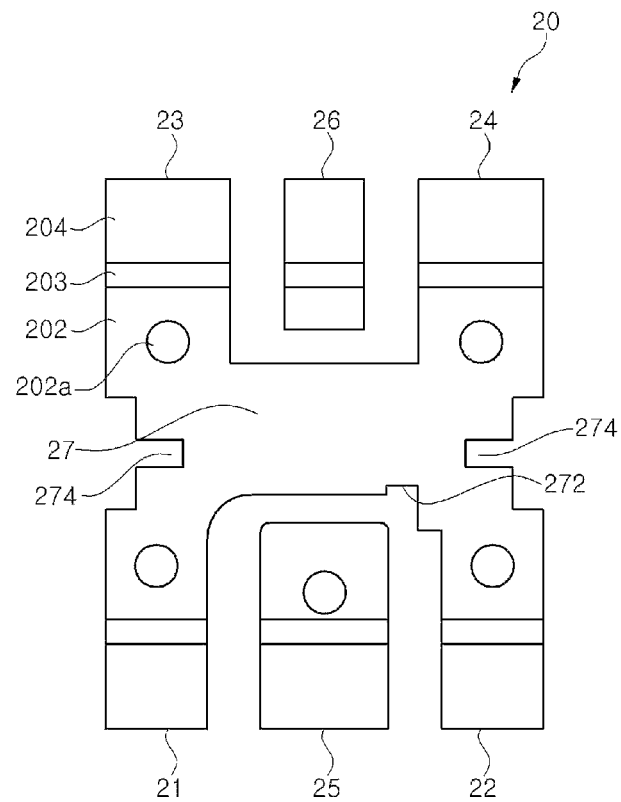
FIG. 3 is a plan view of a lead frame of the light emitting diode package shown in FIG. 1 and FIG. 2.

FIG. 1 to FIG. 3 are views of a light emitting diode package according to an exemplary embodiment of the present invention.

Referring to FIG. 1 to FIG. 3, the light emitting diode package 1 according to the present exemplary embodiment includes a light emitting diode chip 10, a lead frame 20, and a package body 30.

The package body 30 supports the lead frame 20. The package body 30 may be formed of a plastic resin by injection molding. An upper surface of the package body 30 may include a cavity. Part of the lead frame 20 and the light emitting diode chip 10 mounted on one region of the lead frame 20 are exposed through the cavity. The cavity may be formed with a light-transmitting encapsulating member (not shown). The encapsulating member may include at least one phosphor. The package body 30 has opposite side surfaces, that is, a first side surface 31 and a second side surface 32. Further, the package body 30 has a third side surface 33 and a fourth side surface 34 orthogonal to the first side surface 31 and the second side surface 32, respectively.

The lead frame 20 has a chip area 27 on which the light emitting diode chip 10 is mounted. Further, the lead frame 20 includes first, second, third, fourth, fifth and sixth terminals 21, 22, 23, 24, 25, 26.

The first terminal 21 and the second terminal 22 extend outwards from one side of the chip area 27, and the third terminal 23 and the fourth terminal 24 extend outward from the other side of the chip area 27. The first terminal 21 is parallel to the second terminal 22, and the third terminal 23 is parallel to the fourth terminal 24. The first and second terminals 21, 22 are disposed to face the third and fourth terminals 23, 24, respectively. The first and second terminals 21, 22 extend to the outside beyond the first side surface 31 of the package body 30, and the third and fourth terminals 23, 24 extend to the outside beyond the second side surface 32 of the package body 30.

The fifth terminal 25 is arranged between the first terminal 21 and the second terminal 22, and the sixth terminal 26 is arranged between the third terminal 23 and the fourth terminal 24. The first terminal 21, the second terminal 22, and the fifth terminal 25 may be considered as a first terminal group since they are arranged along the first side surface 31 of the package body 30 (or, similarly, one side of the chip area 27). Likewise, the third terminal 23, the fourth terminal 24, and the sixth terminal 26 may be considered as a second terminal group since they are arranged along the second side surface 32 of the package body 30 (or, similarly, the other side of the chip area 27). The fifth terminal 25 and the sixth terminal 26 are separated from the chip area 27 on which the light emitting diode chip 10 is mounted. The fifth terminal 25 and the sixth terminal 26 are also separated from other terminals, that is, the first, second, third and fourth terminals 21, 22, 23, 24.

As shown in FIG. 1, one electrode of the light emitting diode chip 10 mounted on the chip area 27 is connected to a first wire W1, which is bonded to the chip area 27. Thus, the first, second, third, and fourth terminals 21, 22, 23, 24 integrally connected to the chip area 27 have an identical polarity and are electrically connected to the one electrode of the light emitting diode chip 10. Further, the other electrode of the light emitting diode chip 10 is connected to a second wire W2, which is bonded to the fifth terminal 25. Thus, the fifth terminal 25 has a different polarity than that of the first, second, third, and fourth terminals 21, 22, 23, 24 and is electrically connected to the other electrode of the light emitting diode chip 10. The sixth terminal 26 is a dummy terminal, which is not electrically connected to the light emitting diode chip 10, and aids in reliable and stable bonding of the light emitting diode package 1 to the printed circuit board.

The fifth terminal 25 has a greater width than the sixth terminal 26 to guarantee reliable bonding of the second wire W2. The sixth terminal 26 is not used for wire bonding and thus may not have a great width. At least outside the package body 30, the sixth terminal 26 has a different width than the width of the third terminal 23 and the fourth terminal 24. In the present exemplary embodiment, both inside and outside of the package body 30, the sixth terminal 26 has a smaller width than the third and fourth terminals 23, 24.

Here, when the light emitting diode chip 10 includes an electrode, for example, at a lower side thereof, electrical connection of the light emitting diode chip 10 can be achieved by mounting the light emitting diode chip 10 on the chip area 27, thereby enabling elimination of the first wire W1 as described above.

Both outside and inside the package body 30, the width of the first terminal 21 and the width of the second terminal 22 are smaller than the width of the third terminal 23 and the width of the fourth terminal 24. Further, both outside and inside the package body 30, the fifth terminal 25 has a greater width than the width of the first and second terminals 21, 22. Since a sufficient distance between an inner surface of the first terminal 21 and an inner surface of the second terminal 22 is obtained, it is possible to prevent a short circuit between the fifth terminal 25, the first terminal 21, and/or the second terminal 22 despite the width of the fifth terminal 25. Although the fifth terminal 25 is illustrated as having the same width both outside and inside the package body 30 in the present exemplary embodiment, it can be contemplated that the fifth terminal 25 has a greater width inside the package body 30 than outside the package body 30 for reliable bonding.

In the present exemplary embodiment, since a distance d1 between the inner surface of the first terminal 21 and the inner surface of the second terminal 22 is greater than a distance d2 between the inner surface of the third terminal 23 and the inner surface of the fourth terminal 24, a possibility of short circuit is reduced, and since a distance D1 between an outer surface of the first terminal 21 and an outer surface of the second terminal 22 is equal to a distance D2 between an outer surface of the third terminal 23 and an outer surface of the fourth terminal 24, the light emitting diode package 1 may be stably mounted on the printed circuit board.

As shown in FIG. 2, each of the terminals of the lead frame 20 includes an upper flat section 202 coplanar with the chip area 27, a lower flat section 204 exposed through a lower surface of the package body 30, and a slanted connecting section 203, which connects the upper flat section 202 and the lower flat section 204 within the package body 30. In the present exemplary embodiment, each of the terminals 21, 22, 23, 24, 25, 26 (see FIG. 1) are bent inside the package body 30 and exposed through the lower surface of the package body 30. This structure may be obtained by encapsulating a bent section of each terminal 21, 22, 23, 24, 25, 26 in the plastic resin when the package body 30 is formed of the plastic resin by molding.

Referring again to FIG. 1 to FIG. 3, the lead frame 20 includes connection holes 202a through which upper and lower portions of the package body 30 (with respect to the lead frame 20) are connected to each other. The connection holes 202a may be formed in the upper flat sections 202 of the first, second, third, fourth, and fifth terminals 21, 22, 23, 24, 25. Although the sixth terminal 26 having a relatively small width is not formed with the connection hole in the present exemplary embodiment, it may include a connection hole.

Further, the lead frame 20 includes connection grooves 274 at edges thereof, particularly, at opposite edges of the chip area 27. The connection grooves 274 connect the upper and lower portions of the package body 30 together with the aforementioned connection holes 202a, thereby allowing the lead frame 20 to be more firmly supported by the package body 30.

The lead frame 20 includes a cut-out section 272 for alignment of the light emitting diode chip 10. The cut-out section 272 is formed at an edge of the chip area 27 exposed through the cavity during manufacture of the light emitting diode package 1. As the cut-out section 272 is sensed by an optical device or a sensor capable of detecting the cut-out section 272, it is possible to achieve mounting of the light emitting diode chip 10 at an accurate position of the chip area 27 through detection thereof. An error of detecting a mounting position of the light emitting diode chip 10 may increase with increasing distance between the cut-out section 272 or a mark corresponding thereto and the chip area 27.

Figure 4:
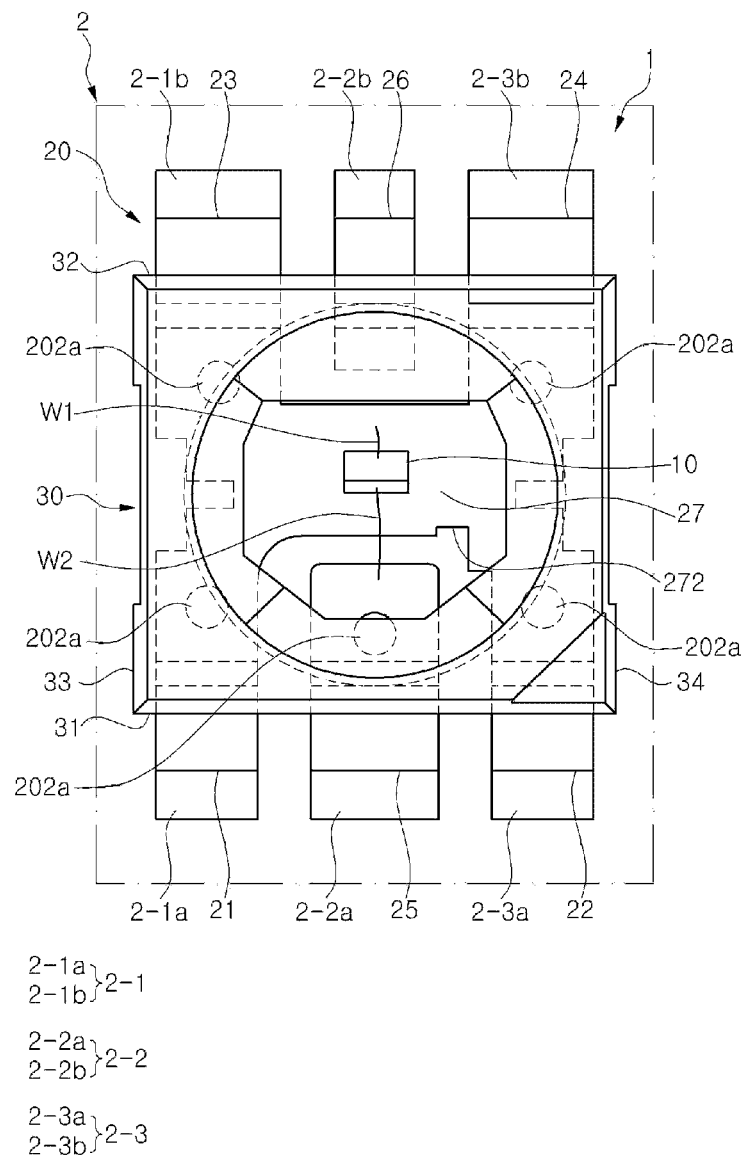
FIG. 4 is a plan view of a light emitting module including the light emitting diode package of FIG. 1 to FIG. 3 on a printed circuit board.
Figure 5A:
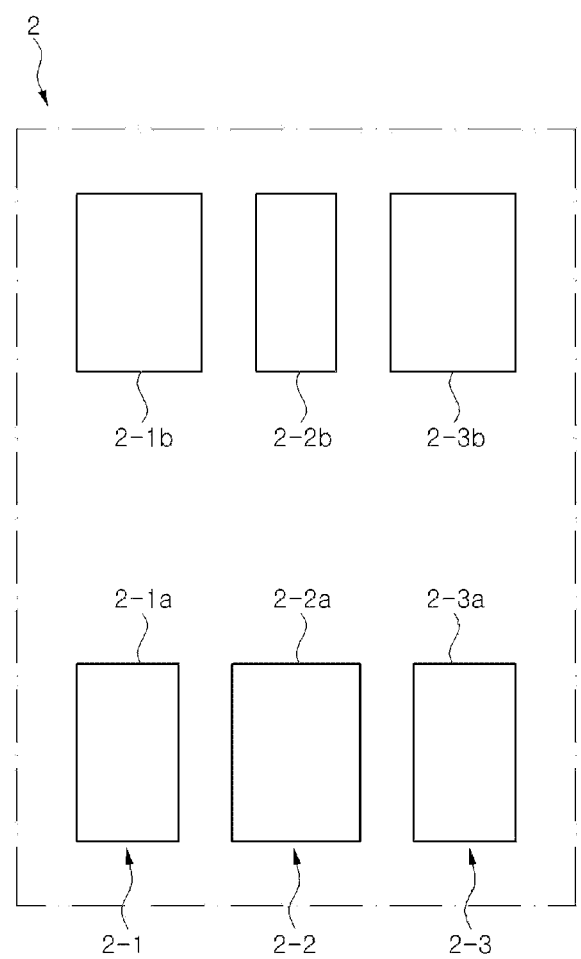
FIG. 5a, FIG. 5b, and FIG. 5c are views illustrating examples of a land pattern suited to the printed circuit board shown in FIG. 4.
Figure 5B:
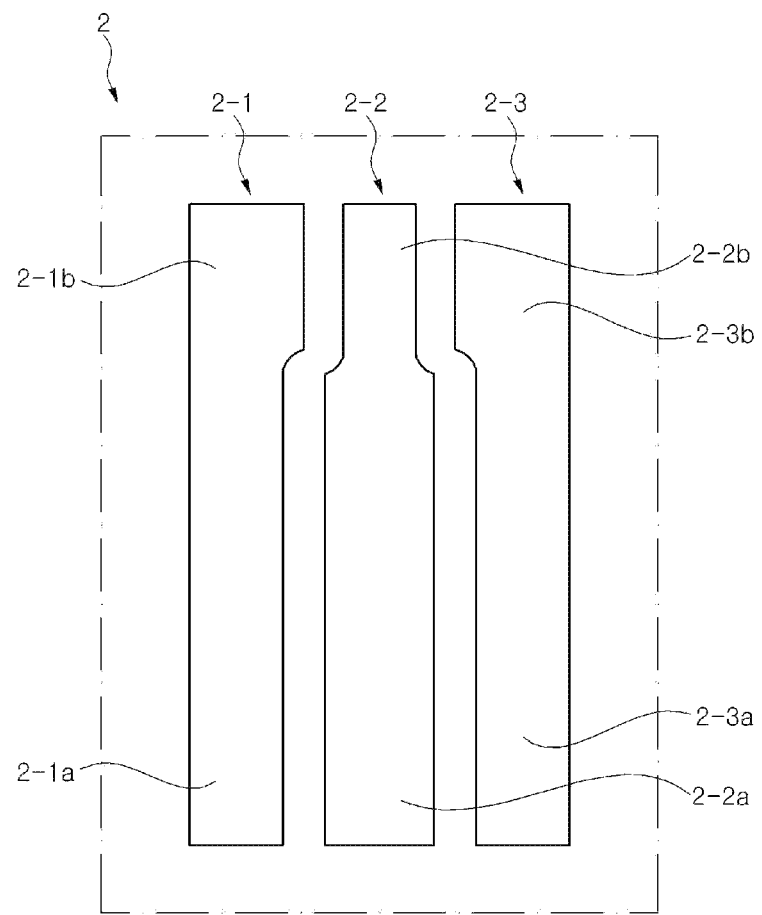
Figure 6A:
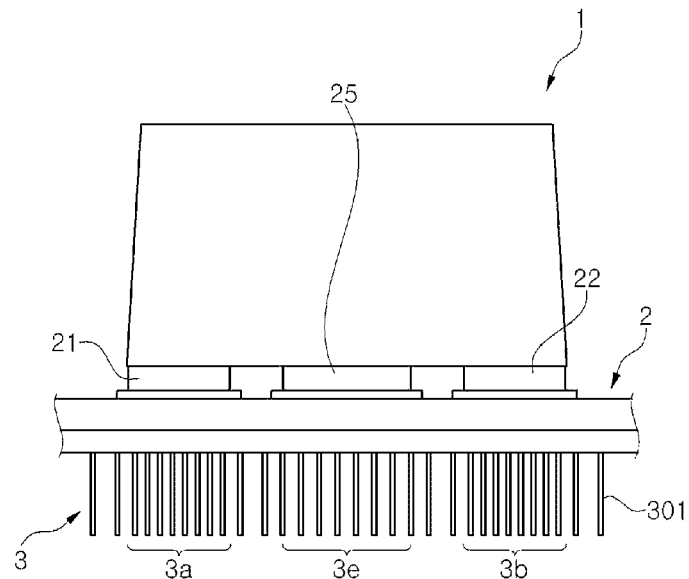
Figure 6B:
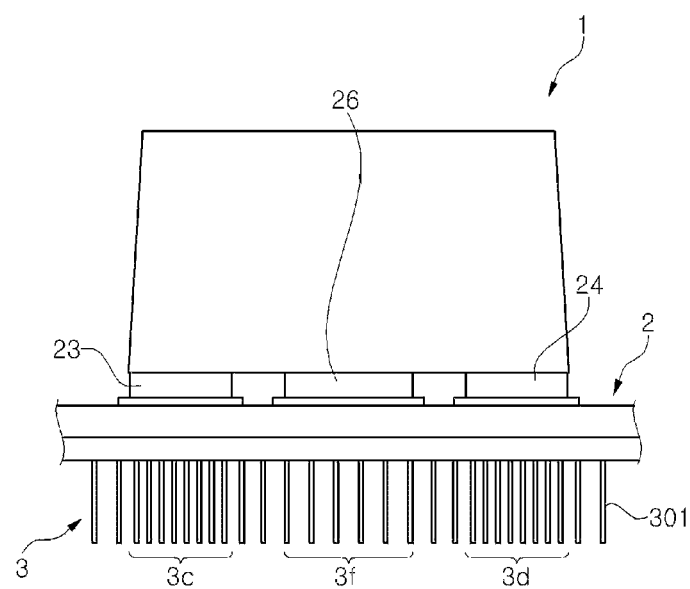

FIG. 4 is a plan view of a light emitting module including the light emitting diode package of FIG. 1 to FIG. 3 on a printed circuit board, FIG. 5a and FIG. 5b are views illustrating examples of a land pattern suited to the printed circuit board shown in FIG. 4; and FIG. 6a and FIG. 6b are side views of the light emitting module shown in FIG. 4, showing opposite sides of the light emitting module. Thus the description above is incorporated by reference in the following description, and any overlapping description may be omitted.

In FIG. 4, the light emitting module includes a printed circuit board 2 on which the light emitting diode package 1 is mounted.

The printed circuit board 2 includes a first land pattern 2-1, a second land pattern 2-2 and a third land pattern 2-3 formed on an upper surface thereof, on which the light emitting diode package 1 is mounted. The first land pattern 2-1, the second land pattern 2-2, and the third land pattern 2-3 are formed parallel to each other. The second land pattern 2-2 is arranged between the first land pattern 2-1 and the third land pattern 2-3.

In the present exemplary embodiment, two opposite terminals of the light emitting diode package 1, that is, the first terminal 21 and the third terminal 23, are bonded to the first land pattern 2-1, and two other opposite terminals of the light emitting diode package 1, that is, the second terminal 22 and the fourth terminal 24, are bonded to the third land pattern 2-3. The first land pattern 2-1 and the third land pattern 2-3 have an identical polarity, and the first, second, third, and fourth terminals 21, 22, 23, 24 have an identical polarity and are electrically connected to the first and third land patterns 2-1, 2-3.

The fifth and sixth terminals 25, 26 arranged at the middle of the light emitting diode package 1 and separated from the first, second, third, and fourth terminals 21, 22, 23, 24 are bonded to the second land pattern 2-2. As described above, the fifth terminal 25 and the sixth terminal 26 are separated from each other, and the sixth terminal 26 is a dummy terminal, which is not electrically connected to the light emitting diode chip 10. The second land pattern 2-2 has a different polarity than that of the first and third land patterns 2-1, 2-3 and is electrically connected to the fifth terminal 25. Here, the second land pattern 2-2 has a front section 2-2a, which is wider than a rear section 2-2b of the second land pattern 2-2, thereby allowing reliable bonding of the fifth terminal 25, which is wider than the sixth terminal 206.

Further, the first land pattern 2-1 has a front section 2-1a to which the first terminal 21 is bonded and which has a smaller width than a rear section 2-1b of the first land pattern 2-1 to which the third terminal 23 is bonded. The third land pattern 2-3 also has a front section 2-3a to which the second terminal 22 is bonded and which has a smaller width than a rear section 2-3b of the third land pattern 2-3 to which the fourth terminal 24 is bonded.

The second land pattern 2-2 may be a separated pattern having a front section 2-2a and a rear section 2-2b that are separated from each other, as shown in FIG. 5a. Alternatively, the second land pattern 2-2 may be an integral pattern having the front section 2-2a and the rear section 2-2b connected to each other, as shown in FIG. 5b. Since the rear section 2-2b of the second land pattern 2-2 is bonded to the sixth terminal 26, that is, the dummy terminal, a short circuit does not occur when the front section 2-2a is connected to or disconnected from the rear section 2-2b.

The first land pattern 2-1 may be a separated pattern having the front section 2-1a and the rear section 2-1b separated from each other, as shown in FIG. 5a. Alternatively, the first land pattern 2-1 may be an integral pattern having the front section 2-1a and the rear section 2-1b connected to each other, as shown in FIG. 5b. Since the first and third terminals 21, 23 bonded to the front and rear sections 2-1a, 2-1b of the first land pattern 2-1 have an identical polarity, a short circuit does not occur when the front section 2-1a is connected to or disconnected from the rear section 2-1b.

The third land pattern 2-3 may be a separated pattern having the front section 2-3a and the rear section 2-3b separated from each other, as shown in FIG. 5a. Alternatively, the third land pattern 2-3 may be an integral pattern having the front section 2-3a and the rear section 2-3b connected to each other, as shown in FIG. 5b. Since the second and fourth terminals 22, 24 bonded to the front and rear sections 2-3a, 2-3b of the third land pattern 2-3 have an identical polarity, a short circuit does not occur when the front section 2-3a is connected to or disconnected from the rear section 2-3b.

Figure 5C:
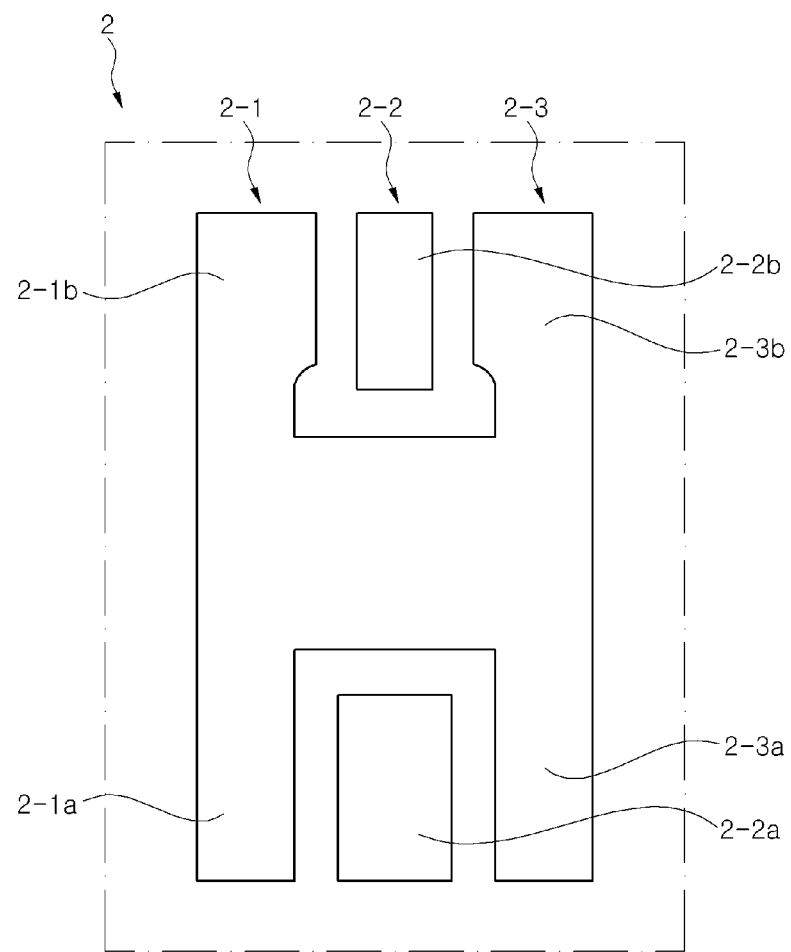

In the present exemplary embodiment, the chip area 27 of the lead frame 20 is not exposed through the lower surface of the package body 30. However, the height of the chip area 27 of the lead frame 20 may be lowered so as to expose the chip area 27 of the lead frame 20 through the lower surface of the package body 30. As shown in FIG. 5c, a central land pattern is further formed to connect the first land pattern 2-1 and the second land pattern 2-3 through a gap between the front section 2-2a and the rear section 2-2b of the second land pattern 2-2, which are separated from each other, such that the central land pattern is in contact with the chip area 27 of the lead frame 20, or is bonded thereto.

As shown in FIG. 6a and FIG. 6b, the light emitting module includes a heat sink 3 attached to the lower surface of the printed circuit board 2 on which the light emitting diode package 1 is mounted. The heat sink 3 includes a plurality of heat dissipation fins 301 on a lower surface thereof. Here, the heat sink 30 includes zones having different densities of heat dissipation fins 301. The density of heat dissipation fins 301 for each terminal may be set depending on the heat generation rate of the corresponding terminal upon operation of the light emitting diode chip 10.

First, referring to FIG. 6a, first and second zones 3a, 3b of the heat sink 3 disposed directly under the first and second terminals 21, 22 have a higher density of heat dissipation fins 301 than a fifth zone 3e of the heat sink 3 disposed directly under the fifth terminal 25. Since the first and second terminals 21, 22 are integrally connected to the chip area of the lead frame 20 connected to the light emitting diode package 1, the first and second zones 3a, 3b of the heat sink 3 disposed directly under the first and second terminals 21, 22 may increase in density of heat dissipation fins 301 by decreasing the distance between the heat dissipation fins 301.

Next, referring to FIG. 6b, third and fourth zones 3c, 3d of the heat sink 3 disposed directly under the third and fourth terminals 23, 24 have a higher density of heat dissipation fins 301 than a sixth zone 3f of the heat sink 3 disposed directly under the sixth terminal 26. Since the third and fourth terminals 23, 24 are integrally connected to the chip area 27 of the lead frame 20 connected to the light emitting diode package 1, the third and fourth zones 3c, 3d of the heat sink 3 disposed directly under the third and fourth terminals 23, 24 may have an increased density of heat dissipation fins 301 by decreasing the distance between the heat dissipation fins 301.

Referring to FIG. 6a and FIG. 6b, a fifth zone 3e of the heat sink 3 disposed directly under the fifth terminal 25 has a higher density of heat dissipation fins 301 than the sixth zone 3f of the heat sink 3 disposed directly under the sixth terminal 26. Since the sixth terminal 26 is a dummy terminal and may receive less heat than any other terminals during operation of the light emitting diode chip, the sixth zone 3f of the heat sink 3 disposed directly under the sixth terminal 26 has a low density of heat dissipation fins.

As described above, when the light emitting diode package 1 including a lead frame 20 having terminals with different widths is mounted on the printed circuit board 2 using a reflow soldering device, the reflow soldering device may be set to have different temperature zones therein. Thus, it is possible to prevent failure of the light emitting diode package 1 due to differences in thermal expansion and contraction. For example, the highest temperature zone may be placed at the middle of the device to minimize contraction rate.

Figure 7:
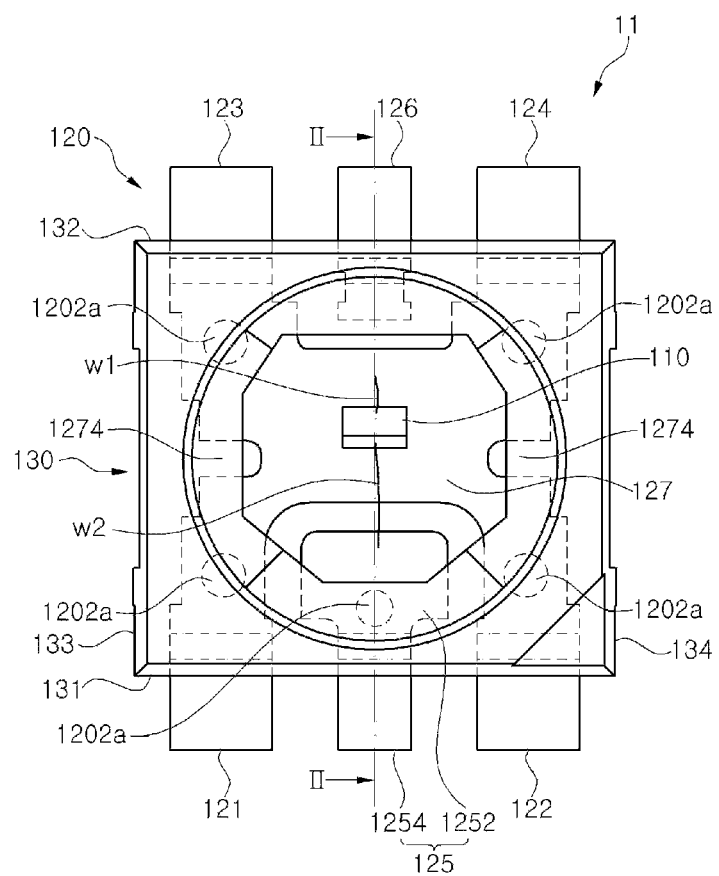
FIG. 7 is a plan view of a light emitting diode package in accordance with an exemplary embodiment of the present invention.
Figure 8:
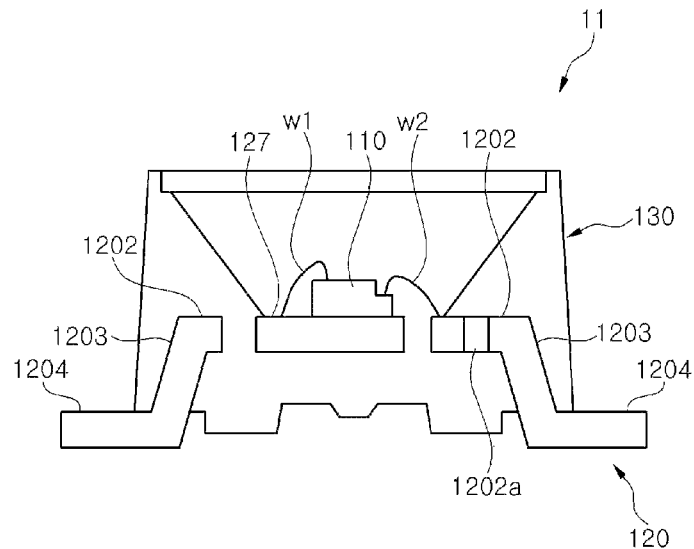
FIG. 8 is a cross-sectional view taken along line II-II of FIG. 7.
Figure 9:
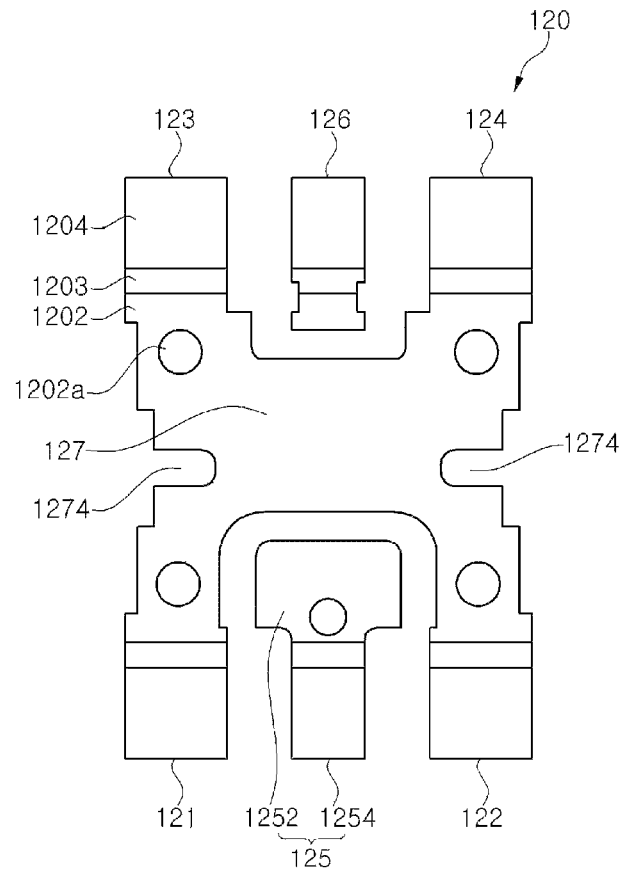
FIG. 9 is a plan view of a lead frame of the light emitting diode package shown in FIG. 7 and FIG. 8.

FIG. 7 to FIG. 9 are views of a light emitting diode package according to an exemplary embodiment of the present invention. The exemplary embodiment shown in FIG. 7 to FIG. 9 is similar to the exemplary embodiment described above with reference to FIG. 1 to FIG. 3, and thus the description above is incorporated by reference in the following description, and any overlapping description may be omitted.

Referring to FIG. 7 to FIG. 9, the light emitting diode package 11 according to the present exemplary embodiment includes a light emitting diode chip 110, a lead frame 120, and a package body 130.

The package body 130 supports the lead frame 120. The package body 130 may be formed of a plastic resin by injection molding. The package body 130 may include a cavity at an upper surface thereof. Part of the lead frame 120 and the light emitting diode chip 110 mounted on one region of the lead frame 120 may be exposed through the cavity. The cavity may be formed with a light-transmitting encapsulating member. The encapsulating member may include phosphors. The package body 130 has opposite side surfaces, that is, a first side surface 131 and a second side surface 132. Further, the package body 130 has a third side surface 133 and a fourth side surface 134 orthogonal to the first side surface 131 and the second side surface 132, respectively.

The lead frame 120 has a chip area 127 on which the light emitting diode chip 110 is mounted. Further, the lead frame 120 includes first, second, third, fourth, fifth and sixth terminals 121, 122, 123, 124, 125, and 126.

The first terminal 121 and the second terminal 122 extend outwards from one side of the chip area 127, and the third terminal 123 and the fourth terminal 124 extend outward from the other side of the chip area 127. The first terminal 121 is parallel to the second terminal 122, and the third terminal 123 is parallel to the fourth terminal 124. The first and second terminals 121, 122 are disposed to face the third and fourth terminals 123, 124, respectively. The first and second terminals 121, 122 extend to the outside beyond the first side surface 131 of the package body 130, and the third and fourth terminals 123, 124 extend to the outside beyond the second side surface 132 of the package body 130.

The fifth terminal 125 is placed between the first terminal 121 and the second terminal 122 to constitute one group together with the first and second terminals 121, 122, and the sixth terminal 126 is placed between the third terminal 123 and the fourth terminal 124 to constitute another group together with the third and fourth terminals 123, 124.

The fifth terminal 125 and the sixth terminal 126 are separated from the chip area 127 on which the light emitting diode chip 110 is mounted. The fifth terminal 125 and the sixth terminal 126 are separated from other terminals, that is, the first, second, third and fourth terminals 121, 122, 123, 124.

As shown in FIG. 7, one electrode of the light emitting diode chip 110 mounted on the chip area 127 is connected to a first wire w1, which is bonded to the chip area 127. Thus, the first, second, third, and fourth terminals 121, 122, 123, 124 integrally connected to the chip area 127 have an identical polarity and are electrically connected to the one electrode of the light emitting diode chip 110. Further, the other electrode of the light emitting diode chip 110 is connected to a second wire w2, which is bonded to the fifth terminal 125. Thus, the fifth terminal 125 has a different polarity than that of the first, second, third and fourth terminals 121, 122, 123, 124, and is electrically connected to the other electrode of the light emitting diode chip 110. The sixth terminal 126 is a dummy terminal, which is not electrically connected to the light emitting diode chip 110, and aids in reliable and stable bonding of the light emitting diode package 1 to a printed circuit board.

The fifth terminal 125 includes a buried section 1252 buried in the package body 130 and an exposed section 1254 exposed outside the package body 130. The buried section 1252 of the fifth terminal 125 has a greater width than the exposed section 1254 thereof in order to guarantee reliable bonding of the second wire w2 described above. Further, the buried section 1252 of the fifth terminal 125 has a greater width than the width of the first and second terminals 121, 122 in the package body 130.

Since the sixth terminal 126 does not need wire bonding, it does not need a relatively great width. Outside the package body 130, the width of the fifth terminal 125 may be the same as that of the sixth terminal 126. In addition, since the sixth terminal 126 does not need connection with a wire and mounting with the light emitting diode chip 110, the sixth terminal 126 is not present inside the cavity. Both inside and outside the package body 130, the sixth terminal 126 has a greater width than those of the third and fourth terminals 123, 124.

Outside the package body 130, the widths of the first and second terminals 121, 122 may be the same as those of the widths of the third and fourth terminals 123, 124, respectively. Inside the package body 130, the first, second, third and fourth terminals 121, 122, 123, 124 may have the same widths as well.

Among the terminals of one group at one side of the package body 130, that is, among the first, second, and fifth terminals 121, 122, 125, the fifth terminal 125 may have a smaller width than those of the first and second terminals 121, 122 outside the package body 130. In addition, among the terminals of one group at the other side of the package body 130, that is, among the third, fourth and sixth terminals 123, 124, 126, the sixth terminal 126 may have a smaller width than those of the third and fourth terminals 123, 124 outside the package body 130.

As shown in FIG. 8, each of the terminals of the lead frame 120 include an upper flat section 1202 coplanar with the chip area 127, a lower flat section 1204 exposed through a lower surface of the package body 130, and a slanted connecting section 1203, which connects the upper flat section 1202 and the lower flat section 1204 within the package body 130. Each of the terminals 121, 122, 123, 124, 125, 126 (as shown in FIG. 7) are bent inside the package body 130 as described with respect to the upper flat section 1202, connecting section 1203, and lower flat section 1204 shown in FIG. 8, and are exposed through the lower surface of the package body 130. This structure may be obtained by encapsulating a bent section of each terminal 121, 122, 123, 124, 125, 126 in the plastic resin when the package body 130 is formed of the plastic resin by molding.

Referring again to FIG. 7 to FIG. 9, the lead frame 120 includes connection holes 1202a through which upper and lower portions of the package body 130 with respect to the lead frame 120 are connected to each other. The connection holes 1202a may be formed in the upper flat sections 1202 of the first, second, third, fourth, and fifth terminals 121, 122, 123, 124, 125.

Further, the lead frame 120 includes connection grooves 1274 at edges thereof, particularly, at opposite edges of the chip area 127. The connection grooves 1274 connect the upper and lower portions of the package body 130 together with the aforementioned connection holes 1202a, thereby allowing the lead frame 120 to be more firmly supported by the package body 130.

Figure 10:
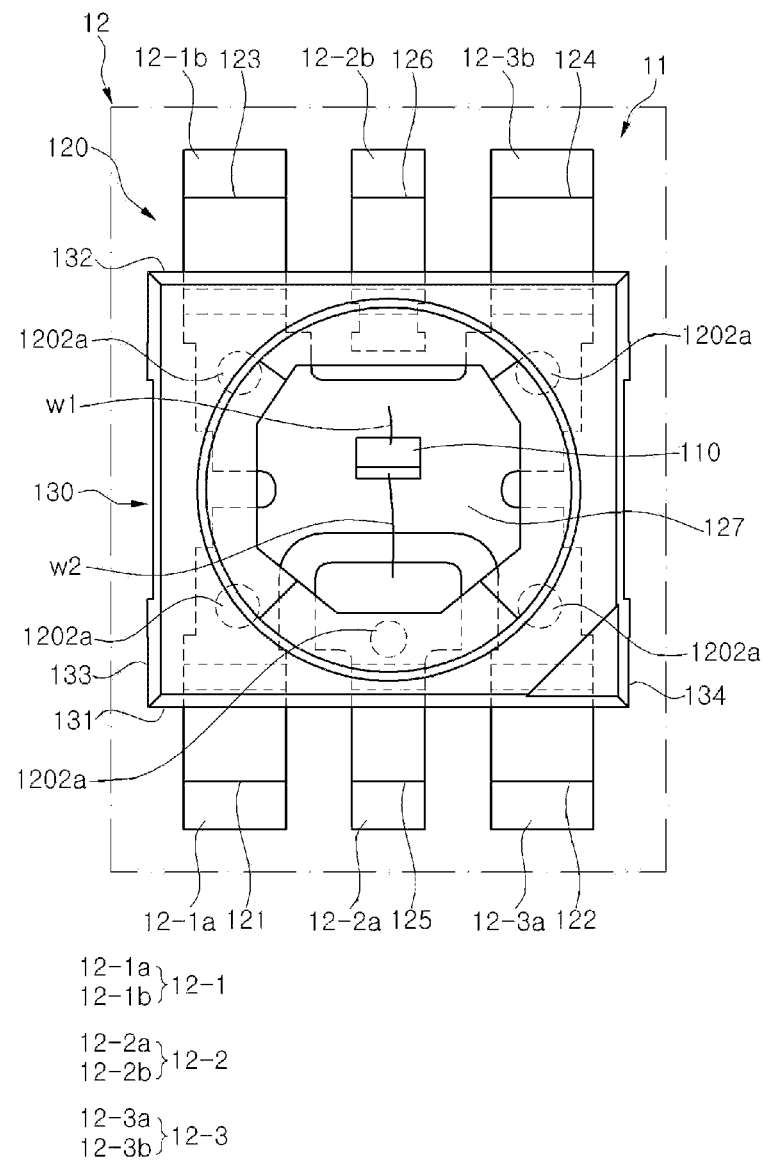
FIG. 10 is a plan view of a light emitting module including the light emitting diode package of FIG. 7 to FIG. 9 on a printed circuit board.
Figure 11:
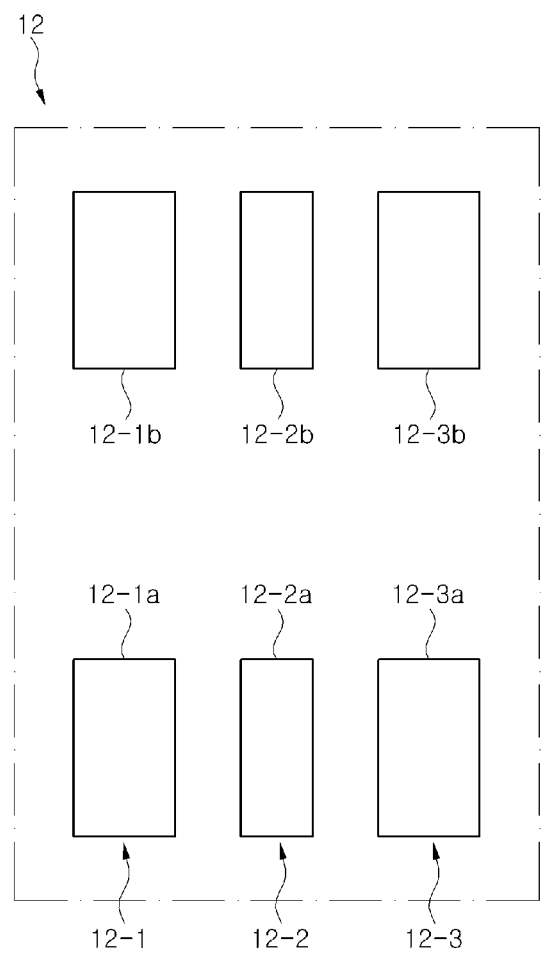
FIG. 11 and FIG. 12 are views illustrating examples of a land pattern suited to the printed circuit board shown in FIG. 10.
Figure 12:
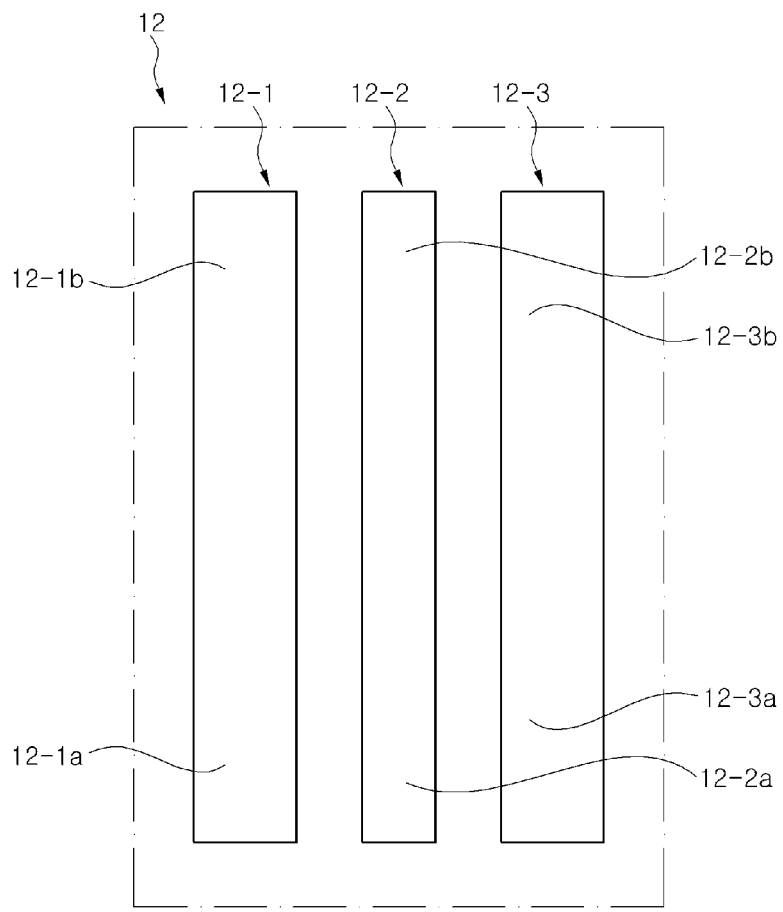

FIG. 10 is a plan view of a light emitting module including the light emitting diode package of FIG. 7 to FIG. 9 on a printed circuit board according to an exemplary embodiment of the present invention. FIG. 11 and FIG. 12 are views illustrating examples of a land pattern suited to the printed circuit board shown in FIG. 10. The exemplary embodiment shown in FIG. 10 is similar to the description above with reference to FIG. 1, and FIG. 11 and FIG. 12 are similar to the description above with reference to FIG. 5a and FIG. 5b, thus the description above is incorporated by reference in the following description, and any overlapping description may be omitted.

In FIG. 10, the light emitting module includes a printed circuit board 12 on which the light emitting diode package 11 is mounted.

The printed circuit board 12 includes a first land pattern 12-1, a second land pattern 12-2, and a third land pattern 12-3 formed on an upper surface thereof, on which the light emitting diode package 11 is mounted. The first land pattern 12-1, the second land pattern 12-2, and the third land pattern 12-3 are formed parallel to each other. The second land pattern 12-2 is arranged between the first land pattern 12-1 and the third land pattern 12-3.

In the present exemplary embodiment, two opposite terminals of the light emitting diode package 11, that is, the first terminal 121 and the third terminal 123, are bonded to the first land pattern 12-1, and two other opposite terminals of the light emitting diode package 11, that is, the second terminal 122 and the fourth terminal 124, are bonded to the third land pattern 12-3. The first land pattern 12-1 and the third land pattern 12-3 have an identical polarity, and the first, second, third, and fourth terminals 121, 122, 123, 124 have an identical polarity and are electrically connected to the first and third land patterns 12-1, 12-3.

The fifth and sixth terminals 125, 126 arranged between and separated from the first, second, third, and fourth terminals 121, 122, 123, 124 are bonded to the second land pattern 12-2. As described above, the fifth terminal 125 and the sixth terminal 126 are separated from each other, and the sixth terminal 126 is a dummy terminal, which is not electrically connected to the light emitting diode chip 110.

The first land pattern 12-1 has a front section 12-1a to which an exposed section of the first terminal 121 is bonded and which has the same width as that of a rear section 12-1b of the first land pattern 12-1, to which an exposed section of the third terminal 123 is bonded. The third land pattern 12-3 also has a front section 12-3a to which an exposed section of the second terminal 122 is bonded and which has the same width as that of a rear section 12-3b of the third land pattern 12-3, to which an exposed section of the fourth terminal 124 is bonded.

The second land pattern 12-2 may be a separated pattern having a front section 12-2a and a rear section 12-2b that are separated from each other, as shown in FIG. 11. Alternatively, the second land pattern 12-2 may be an integral pattern having the front section 12-2a and the rear section 12-2b connected to each other, as shown in FIG. 12. Since the rear section 12-2b of the second land pattern 12-2 is bonded to the sixth terminal 126, that is, the dummy terminal, a short circuit may not occur regardless whether the front section 12-2a is connected to or disconnected from the rear section 12-2b.

The first land pattern 12-1 may be a separated pattern having the front section 12-1a and the rear section 12-1b separated from each other, as shown in FIG. 11. Alternatively, the first land pattern 12-1 may be an integral pattern having the front section 12-1a and the rear section 12-1b connected to each other, as shown in FIG. 12. Since the first and third terminals 121, 123 bonded to the front and rear sections 12-1a, 12-1b of the first land pattern 12-1 have an identical polarity, a short circuit does not occur regardless whether the front section 12-1a is connected to or disconnected from the rear section 12-1b.

The third land pattern 12-3 may be a separated pattern having the front section 12-3a and the rear section 12-3b separated from each other, as shown in FIG. 11. Alternatively, the third land pattern 12-3 may be an integral pattern having the front section 12-3a and the rear section 12-3b connected to each other, as shown in FIG. 12. Since the second and fourth terminals 122, 124 bonded to the front and rear sections 12-3a, 12-3b of the third land pattern 12-3 have an identical polarity, a short circuit does not occur regardless whether the front section 12-3a is connected to or disconnected from the rear section 12-3b.

As described above, when the light emitting diode package including a lead frame having terminals with different widths is mounted on the printed circuit board using a reflow soldering device, the reflow soldering device may be set to have different temperature zones therein, and it is thus possible to prevent failure due to differences in thermal expansion and contraction. For example, the highest temperature zone may be placed at the middle of the device to minimize contraction rate.

According to the exemplary embodiments of the present invention, the light emitting diode package includes terminals having suitable shapes, sizes, and/or arrangement, which may improve reliability of electrical testing and/or reliability of bonding to a printed circuit board. Accordingly, it is possible to improve reliability of a soldering process and/or electrical testing in manufacture of the light emitting diode package.

Further, according to exemplary embodiments of the present invention, a lead frame of the light emitting diode package is bent within a package body to connect an upper flat section inside the package body to a lower flat section outside the package body via a slanted connecting section within the package body, so that the light emitting diode package provides a number of moisture infiltration paths to the lead frame in the package body, thereby reducing interface failure due to water.

Further, according to exemplary embodiments of the present invention, the lead frame is formed with the connection hole which connects upper and lower portions of the package body to each other, thereby improving durability and reliability of the light emitting diode package. A heat sink attached to the lower side of the printed circuit board may have a plurality of zones having different densities of heat dissipation fins set in consideration of heat dissipation characteristics of the light emitting diode package, thereby improving heat dissipation performance of the light emitting module including the light emitting diode package It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode package, comprising:
a light emitting diode chip;
a lead frame comprising a chip area on which the light emitting diode chip is arranged;
a package body supporting the lead frame; and
a first electrode connected to the light emitting diode chip and a second electrode connected to the light emitting diode chip,
wherein the lead frame comprises a first terminal group arranged at a first side of the chip area and a second terminal group arranged at a second side of the chip area,
wherein the first terminal group comprises a first terminal and a second terminal extending from the first side of the chip area, and a fifth terminal separated from the chip area and arranged between the first terminal and the second terminal,
wherein the second terminal group comprises a third terminal and a fourth terminal extending from the second side of the chip area, and a sixth terminal separated from the chip area and arranged between the third terminal and the fourth terminal,
wherein the fifth terminal comprises a greater width than the first terminal and the second terminal inside the package body,
wherein the first electrode is electrically connected to the first terminal, the second terminal, the third terminal, and the fourth terminal and the second electrode is electrically connected to the fifth terminal,
wherein the first electrode comprises an opposite polarity to the second electrode, and
wherein the sixth terminal comprises a dummy terminal.

2. The light emitting diode package of claim 1, wherein the fifth terminal comprises a greater width than the sixth terminal inside the package body.

3. The light emitting diode package of claim 1, wherein the first terminal and the second terminal comprise the same widths as the third terminal and the fourth terminal outside the package body, respectively.

4. The light emitting diode package of claim 1, wherein the first terminal and the second terminal comprise the same widths as the third terminal and the fourth terminal inside the package body, respectively.

5. The light emitting diode package of claim 1, wherein the first terminal, the second terminal, and the fifth terminal extend to the outside of the package body through a first side of a lower surface of the package body opposite to a second side of the lower surface of the package body through which the third terminal, the fourth terminal, and the sixth terminal extend to the outside of the package body.

6. The light emitting diode package of claim 1, wherein the chip area comprises a cut-out section.

7. A light emitting module, comprising:
   a printed circuit board; and
   a light emitting diode package arranged on the printed circuit board, the light emitting diode package comprising:
     a light emitting diode chip;
     a lead frame comprising a chip area on which the light emitting diode chip is arranged;
     a package body supporting the lead frame; and
     a heat sink coupled to the printed circuit board,
     wherein the lead frame comprises a first terminal group arranged at a first side of the chip area and a second terminal group arranged at a second side of the chip area,
     wherein the first terminal group and the second terminal group each comprise a first terminal connected to the chip area and a second terminal separated from the chip area, and
     wherein the width of the first terminal is different than the width of the second terminal outside the package body,
   wherein the printed circuit board comprises a plurality of lands to which the terminals are connected, and
   wherein a first zone of the heat sink disposed directly under the first terminal, the second terminal, the third terminal, and the fourth terminal comprises a greater number of heat dissipation fins than that of a second zone of the heat sink disposed directly under the fifth terminal or a third zone of the heat sink disposed directly under the sixth terminal.

8. The light emitting module of claim 7, wherein the first terminal group comprises a first terminal and a second terminal extending from a first side of the chip area and a fifth terminal separated from the chip area and arranged between the first terminal and the second terminal, and
   wherein the second terminal group comprises a third terminal and a fourth terminal extending from a second side of the chip area opposite to the first side, and a sixth terminal separated from the chip area and arranged between the third terminal and the fourth terminals, the fifth terminal comprising a greater width than the sixth terminal inside the package body.

9. The light emitting module of claim 7, further comprising:
   a heat sink to which the printed circuit board is attached,
   wherein the heat sink comprises a plurality of zones having different densities of heat dissipation fins corresponding to heat generation rates of the terminals.

* * * * *